United States Patent [19]
Terashi

[11] Patent Number: 6,120,906
[45] Date of Patent: Sep. 19, 2000

[54] INSULATED BOARD FOR A WIRING BOARD

[75] Inventor: Yoshitake Terashi, Kokubu, Japan

[73] Assignee: Kyocera Corporation, Kyoto, Japan

[21] Appl. No.: 09/049,312

[22] Filed: Mar. 27, 1998

[30] Foreign Application Priority Data

| Mar. 31, 1997 | [JP] | Japan | 8-079811 |
| Jun. 20, 1997 | [JP] | Japan | 8-164346 |
| Oct. 31, 1997 | [JP] | Japan | 8-300932 |
| Dec. 24, 1997 | [JP] | Japan | 8-354314 |

[51] Int. Cl.$^7$ .................................................. C03C 10/02
[52] U.S. Cl. .............................. 428/426; 428/428; 501/5; 501/11; 501/16; 501/32; 501/134
[58] Field of Search ................................. 501/1, 2, 4, 5, 501/11, 16, 32, 134, 21; 428/426, 209, 428

[56] References Cited

U.S. PATENT DOCUMENTS

| 4,624,934 | 11/1986 | Kokubu et al. | 501/17 |
| 4,749,665 | 6/1988 | Yano et al. | 501/32 |
| 4,777,092 | 10/1988 | Kawakami et al. | 428/428 |
| 4,830,988 | 5/1989 | Hang et al. | 501/21 |
| 4,939,021 | 7/1990 | Aoki et al. | 428/209 |
| 5,196,381 | 3/1993 | Hu et al. | 501/10 |
| 5,216,207 | 6/1993 | Prabhu et al. | 501/21 |
| 5,316,985 | 5/1994 | Jean et al. | 501/16 |
| 5,491,116 | 2/1996 | Beall et al. | 501/5 |
| 5,581,876 | 12/1996 | Prabhu et al. | 428/209 |
| 5,756,408 | 5/1998 | Terashi et al. | 501/8 |
| 5,763,059 | 6/1998 | Yamaguchi et al. | 428/209 |
| 5,916,834 | 6/1999 | Terashi et al. | 501/134 |

Primary Examiner—Archene Turner
Attorney, Agent, or Firm—Hogan & Hartson, LLP

[57] ABSTRACT

The insulated board of this invention is a sintered body of a complex oxide containing Si, Al, Mg, Zn and B as constituent elements. This sintered body contains a spinel crystal phase containing at least ZnO and $Al_2O_3$ and a quartz crystal phase. Since the amorphous phase does not substantially contain ZnO, $Al_2O_3$ or MgO, the sintered body has a low dielectric loss of $30 \times 10^{-4}$ or below and a dielectric constant of 30 or below at a frequency of 15 to 20 GHz. As a result, by forming a wiring layer on the surface or the inside of the insulated board of this invention, the insulated board can transmit high frequency signals at a low loss as the wiring layer.

9 Claims, 2 Drawing Sheets

INSULATED BOARD FOR A WIRING BOARD

BACKGROUND OF THE INVENTION

1. Field of the Invention

This invention relates to an insulated board used in a wiring board, especially preferably an insulated board used as a wiring board in a package, a dielectric resonator, an LC filter, a dielectric waveguide line, and a dielectric antenna, in which high frequency signals such as microwaves or millimetric waves are transmitted.

2. Description of the Prior Art

As multilayer wiring boards made of ceramics, wiring layers composed of high melting metals such as tungsten or molybdenum on the surfaces or the interior of an insulated substrate composed of alumina sintered body have been spread most.

With highly information-oriented society in recent years, frequency bands of signals used in various electrical appliances have become higher frequencies. A higher frequency wiring board used in transmitting high frequency signals is required that in transmitting high frequency signals without a loss, the resistance of the conductor forming a wiring layer should be small, and that the dielectric loss in the high frequency region of the insulated board should be small. However, since the high melting metals such as tungsten and molybdenum have a high conductor resistance, these metals cannot be applied to a wiring substrate used in transmitting signals in a millimetric wave region of at least 30 GHz. In such a wiring substrate, it is necessary to use low-resistance metals such as copper, silver and gold.

However, the wiring layer composed of such a low-resistance metal cannot be formed by co-firing with alumina constituting the insulated board. Accordingly, in recent years, an insulated board composed of glass or a composite material comprising glass and ceramics, namely an insulated board made of a glass-ceramic, has been developed.

Japanese Laid-Open Patent Publication No. 12639/1992 discloses a multilayer wiring substrate obtained by simultaneously firing a molded product composed of a mixture of glass and an $SiO_2$-type filler and a wiring layer composed of a low-resistance metal such as copper, silver and gold at 900 to 1000° C. Japanese Laid-Open Patent Publication No. 240135/85 discloses a multilayer wiring substrate prepared by simultaneously firing a molded product composed of a mixture of a zinc borosilicate type glass and a filler such as $Al_2O_3$, zirconia and mullite and a low-resistance metal. Japanese Laid-Open Patent Publication No. 298919/1993 discloses an insulated board formed from a glass-ceramic material in which mullite or cordierite is precipitated as a crystal phase.

The glass-ceramics insulated board disclosed in the above prior art can be formed by simultaneously firing together with a low-resistant metal such as copper, silver and gold. However, a dielectric loss is high, so it cannot be used in the wiring substrate to which a high frequency wave signal having a high frequency of at least 1 GHz is applied. The glass ceramic sintered body has a thermal expansion coefficient of about 3 to 6 ppm/° C. which is lower than the alumina sintered body, and has a defect that the thermal expansion difference from an organic resin material of a printed substrate used in a mother board is large. When a wiring substrate having an insulated board composed of a glass ceramic sintered body is mounted on the mother board having the printed substrate, a thermal expansion difference occurring between the printed substrate and the insulated board due to the heating such as soldering at the time of mounting is large. The stress generated due to the thermal expansion difference causes cracks in the mounting portion, and is liable to cause the wiring layer to peel. Furthermore, when such a wiring board is used in a package in which a semiconductor element is accommodated, the same problem is raised due to a thermal stress caused at the time that the operation/stopping of the semiconductor are repeated.

SUMMARY OF THE INVENTION

Accordingly, it is an object of this invention to provide an insulated board for a wiring board which can be formed by simultaneously firing a wiring conductor composed of a low-resistant metal such as copper, silver and gold, which insulated board has a high thermal expansion coefficient, a low dielectric constant and a low dielectric loss tangent in a high frequency region having at least 1 GHz.

According to this invention, there is provided an insulated board for a wiring board, a sintered body of a composite oxide containing Si, Al, Mg, Zn and B as constituent elements, wherein the sintered body contains, as a main crystal phase, a spinel crystal phase containing ZnO and $Al_2O_3$ and a quartz crystal phase, and the insulated board has a dielectric loss of $30 \times 10^{-4}$ or below and a dielectric constant of 30 or below in a frequency of 15 to 20 GHz.

The insulated board of this invention is composed of a sintered body of a composite oxide containing Si, Al, Mg, Zn and B, but this sintered body is characterized markedly in that a spinel crystal phase containing ZnO and $Al_2O_3$ and a quartz crystal phase as a main crystal phase are precipitated. In the sintered body containing $SiO_2$, $Al_2O_3$, MgO, ZnO and $B_2O_3$ components, when $Al_2O_3$, MgO and ZnO components, especially $Al_2O_3$ and ZnO components, exist as amorphous components, the dielectric loss of the sintered body in the high frequency region increases when the amorphous components become greater. By precipitating these oxides which become the cause of the increase of the dielectric loss as crystal phases, and by constructing the amorphous phases from components other than these oxide components such as $SiO_2$, or both $SiO_2$ and $B_2O_3$ components, the dielectric loss in the high frequency region can be successfully decreased greatly. Hence, the insulated board of this invention, has a dielectric loss of not larger than $30 \times 10^{-4}$, preferably not larger than $2.5 \times 10^{-4}$, and a dielectric constant of not larger than 30 at a frequency of 15 to 20 GHz.

The second characteristic of this invention is that a quartz crystal phase is precipitated together with a spinel crystal phase. The quartz crystal phase has high expansion characteristics in a range of room temperature to 400° C., and for example, has a thermal expansion coefficient of 13 to 20 ppm/° C. Thus, by precipitating the quartz crystal phase, the thermal expansion coefficient of the insulated board becomes high, for example, at least 7 ppm/° C., preferably at least 9 ppm/° C., most preferably 10 ppm/° C. As a result, when a wiring substrate using the insulated board is provided on a mother board containing a printed substrate composed of an organic resin, the thermal expansion difference between the insulated board and the mother board becomes small, and when the wiring board is mounted on the mother board by means of a solder, the damage of the mounted portion or the peel of the wiring layer can be effectively prevented.

DETAILED DESCRIPTION OF THE INVENTION (Organization structure of the sintered body)

Figure 1:
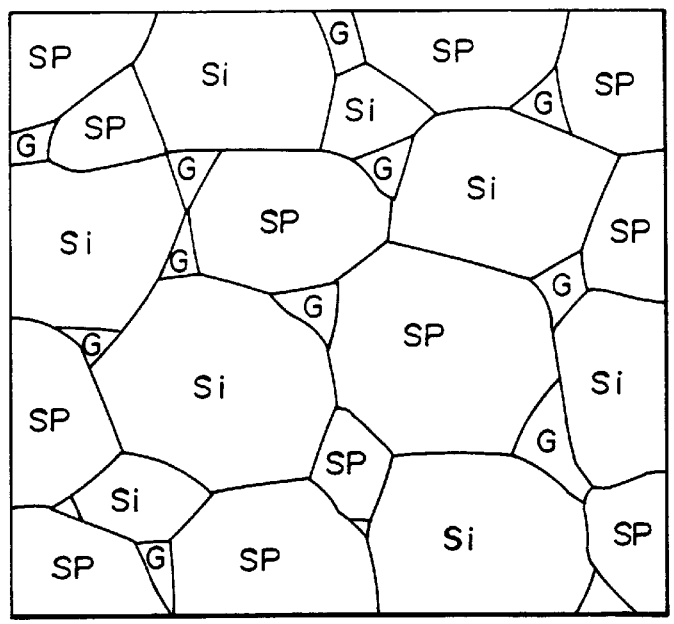
FIGS. 1 to 3 show views for illustrating an example of an organization structure of a sintered body constituting the insulated board of the invention.
Figure 2:
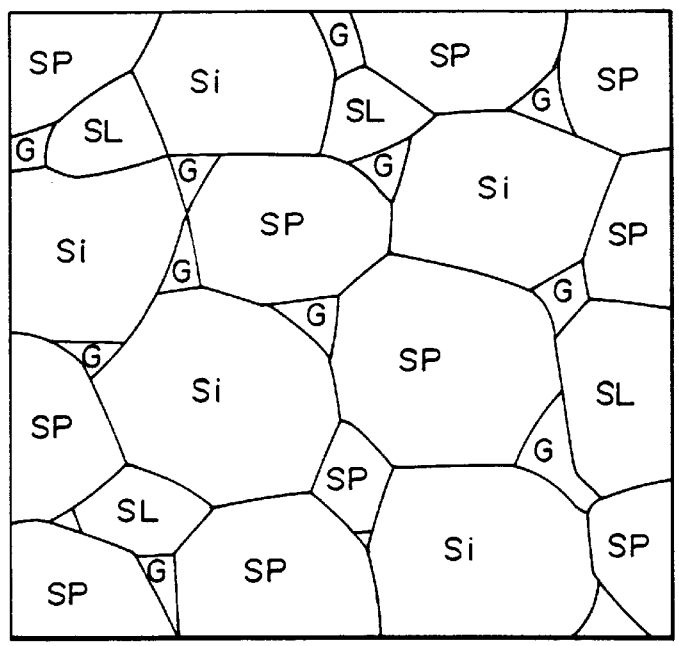
Figure 3:
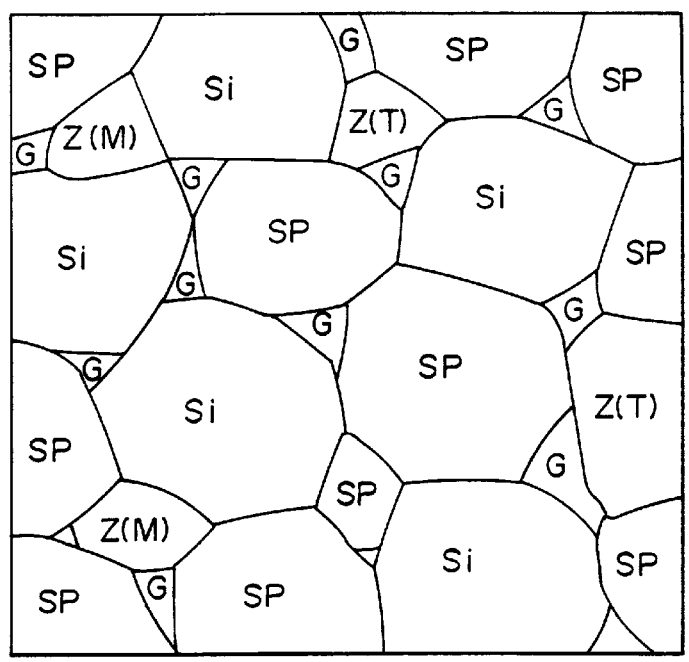

The sintered body constituting the insulated board of this invention is one on which a spinel crystal phase and a quartz crystal phase should be essentially precipitated. In order to exclude Al, Mg and Zn oxides from the amorphous phase or to plan the increasing of thermal expansion of the insulated board, these oxides, or other metal oxides can be precipitated in the form of various crystals. FIGS. 1 to 3 show organized structures of the sintered body classified according to the types of the precipitated crystals.

In FIG. 1, a willemite crystal phase (W) and an enstatite crystal phase (E) are precipitated together with a spinel type crystal phase (SP) and a quartz crystal phase (S), and in the grain boundary of these crystal phases, an amorphous phase (G) is present.

The spinel-type crystal phase (SP) contains at least ZnO and $Al_2O_3$, and is preferably gahnite represented by $ZnAl_2O_4$. Gahnite may have $MgAl_2O_4$ dissolved therein, and may have a spinel crystal structure represented by (Zn, Mg)$Al_2O_4$. The willemite crystal phase (W) contains at least $SiO_2$ and ZnO, and has a crystal structure represented by $Zn_2SiO_4$. The enstatite crystal phase (E) contains at least $SiO_2$ and MgO, and has a crystal structure represented by $MgSiO_3$. By precipitating the spinel type crystal phase (SP), the quarz crystal phase (S), the willemite crystal phase (W) and the enstatite crystal phase (E) in this way, it is understood that the Al, Mg and Zn oxides are excluded from the amorphous phase.

The quartz crystal phase (S) has a crystal structure expressed by $SiO_2$, but as mentioned above, this crystal phase possesses a high thermal expansion coefficient of 13 to 20 ppm/° C. in a range of room temperature to 400° C. By precipitating this crystal phase, the thermal expansion coefficient of the insulated board can be increased. Especially, when the precipitated amount of the quartz crystal phase (S) becomes larger, it is possible to increase the thermal expansion coefficient of the insulated board. In this case, the above gahnite crystal phase also has a comparatively high thermal expansion coefficient of 7 to 8 ppm/° C. Hence, to precipitate the gahnite crystal phase is advantageous to increase the thermal expansion coefficient of the insulated board.

$SiO_2$ crystals include cristobalite and tridymite in addition to quartz. These crystals have a flex point of thermal expansion coefficient near 220° C., and when this flex point is exceeded, the thermal expansion coefficient abruptly increases and therefore, these crystals are improper.

The above-mentioned $Al_2O_3$, MgO and ZnO are substantially precipitated in the crystal phase, and therefore, it is preferred that the amorphous phase (G) is composed substantially of $SiO_2$, or $SiO_2$ and $B_2O_3$. For example, the content of each element of Al, Mg and Zn in the amorphous phase is 5 ppm or below, and the total amount of elements other than Si and B is 100 ppm or below. Accordingly, in the present invention, the dielectric loss in a high frequency region can be decreased, and at a frequency of 15 to 20 GHz, this insulated board shows an extremely low dielectric loss of $30 \times 10^{-4}$ or below, preferably not larger than $25 \times 10^{-4}$ and an extremely low dielectric constant of 30 or below.

In the present invention, such an amorphous phase exists preferably in an amount of 20 to 50% by weight in the sintered body of the above-mentioned complex oxide. When the proportion of the amorphous phase is too large or too small, it becomes difficult to exclude Al, Mg and Zn oxides effectively from the amorphous phase.

The above sintered body may contain cordierite having a crystal structure represented by $2MgO.2Al_2O_3.5SiO_2$, or a crystal phase represented by $Mg_2B_2O_5$.

In the sintered body shown in FIG. 2, instead of the above-mentioned willemite crystal phase (W) and enstatite phase (E), a slawsonite crystal phase (SL) containing Sr, Al and Si ($SrAl_2Si_2O_8$) is precipitated. This slawsonite crystal phase (SL) has a comparatively high thermal expansion coefficient of 7–8 ppm/° C. at room temperature to 400° C. Accordingly, it is advantageous to precipitate the slawsonite crystal phase (SL) in increasing the thermal expansion coefficient of the insulated board. Furthermore, the slawsonite crystal phase advantageously acts in taking out Al, which causes an increase of the dielectric loss, into the crystal phase. Of course, in the sintered body shown in FIG. 2, in the same way as in FIG. 1, it is possible to precipitate the willemite crystal phase (W) or the enstatite crystal phase (E). By this precipitation, oxides of Al, Mg and Zn can be effectively excluded from the amorphous phase.

In the sintered body shown in FIG. 3, instead of the willemite crystal phase (W) and the enstatite crystal phase (E) shown in FIG. 1, the tetragonal system (Z(T)) and the rhombic system (Z(M)) of $ZrO_2$ are precipitated. The $ZrO_2$ crystal phase has a thermal expansion coefficient of 7–9 ppm/° C. at room temperature to 400° C. In other words, this crystal phase has a thermal expansion coefficient which is equivalent to the above-mentioned slawsonite crystal phase (SL) or is higher than the slawsonite crystal phase (SL). Hence, the precipitation of the $ZrO_2$ crystal phase is advantageous in increasing the thermal expansion coefficient of the insulated board. The $ZrO_2$ crystal phase should preferably be tetragonal (Z(T)) than it is rhombic (Z(M)). The thermal expansion with phase transition from the tetragonal system to the rhombic system inhibits the growth of the developed cracks, and as a result, the strength of the insulated board increases. Furthermore, in the sintered body shown in FIG. 3, the above-mentioned willemite crystal phase (W), the enstatite crystal phase (E) and the slawsonite crystal phase (SL) can be precipitated.

(Composition of an insulated board)

The sintered body having the above-mentioned crystal phase and an amorphous phase can be prepared by mixing a powder of crystal glass containing $SiO_2$, $Al_2O_3$, MgO, ZnO and $B_2O_3$ with various oxide powders used for precipitating the above-mentioned various crystal phases or increasing the sinterability, and firing the resulting mixture. Accordingly, the insulated board of this invention constructed with this sintered body contains elements in the following proportions as a basic composition.

$SiO_2$: 30 to 60% by weight $Al_2O_3$: 18 to 25% by weight

MgO: 5 to 13% by weight

ZnO: 5 to 35% by weight $B_2O_3$: 5 to 12% by weight

Other oxide components may be included in the above basic composition according to the type of oxide powders used together with the crystal glass powder. For example, when the sintered body has the organization structure shown in FIG. 1, the composition of the sintered body is as the above basic composition. When the sintered body has the organization structure shown in FIG. 2, the insulated board contains 1 to 3% by weight of SrO and 1 to 3% by weight of $TiO_2$ in addition to the above basic composition. In order to precipitate the slawsonite crystal phase, complex oxide powders such as $SrTiO_3$ are used. When the sintered body has the organization structure shown in FIG. 3, the insulated board contains 1–3% by weight of $ZrO_2$ and a total amount of 6 to 16% by weight of CaO, SrO and BaO in addition to the above basic composition. In order to precipitate $ZrO_2$ of the tetragonal system and the rhombic system, complex oxide powders such as $MZrO_3$ (M: Ca, Sr or Ba) are used.

(Wiring substrate)

The insulated board composed of the sintered body mentioned above is applied to various uses as a wiring board by forming a wiring layer in the surface or the inside.

Figure 4:
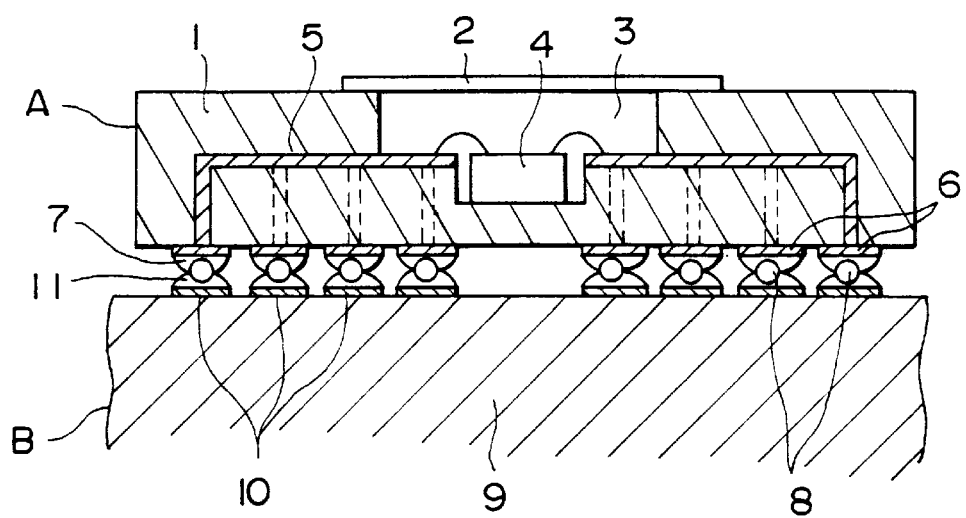
FIG. 4 shows a rough sectional view of a semiconductor package (package loaded with a semiconductor element) using the insulated board of this invention.

FIG. 4 shows an example of using the insulated board of this invention as a wiring board of a package on which a semiconductor element is mounted. In FIG. 4, this package A is a ball grid array (BGA) type package in which a connecting terminal is composed of a ball-like terminal, and is provided with an insulated board 1 of this invention and a lid body 2. A cavity 3 is formed from this insulated board 1 and the lid body 2, and a semiconductor element 4 is loaded in the cavity 3.

The wiring layer 5 is formed on the surface of the insulated board 1, and the semiconductor element 4 in the cavity 3 is electrically connected to the wiring layer 5 so that a high frequency signal may be transmitted between the semiconductor 4 and the wiring layer 5. This connection is performed by loading the semiconductor element 4 immediately on the wiring layer 4 or by using a wire bonding or a TAB tape.

The wiring layer 5 is composed preferably of a low-resistance metal such as copper, silver and gold in order to decrease the conductor loss at the time of transmitting high frequency signals to the utmost. When high frequency signals of at least 1 GHz, especially at least 20 GHz, at least 50 GHz, or at least 70 GHz are. transmitted through the wiring layer 5, this wiring layer 5 should preferably constituted any of a strip line, a microstrip line, a coplanar line and a dielectric guide wave line in order to transmit high frequency signals without any loss. Accordingly, when the wiring layer 5 constitutes such a line, a conductor layer such as a ground layer is formed in the insulated board 1.

An electrode layer 6 for connection to a mother board B is formed on the bottom surface of the insulated board 1. This electrode layer 6 for connection is connected to the wiring layer 5 within a package A and is also fixed to the ball-like terminal 8 by a solder 7. On the other hand, the mother board B has an insulated substrate 9 formed from an insulated material, for example, an organic resin such as a polyimide resin, an epoxy resin or a phenol resin, and the wiring layer 10 is formed on this insulated substrate 9. By connecting the ball-like terminal 8 provided on the electrode layer 6 for connection of the insulated board 1 of the package A to a wiring layer 10 provided in the mother board B, the wiring layer 5 in the package A is electrically connected to the wiring layer 10 of the mother board B.

As mentioned above, the insulated board 1 of this invention does not substantially contain $Al_2O_3$, MgO and ZnO in the amorphous layer of the sintered body forming the insulated board 1. In a range of frequency of 15 to 20 GHz, the insulated board 1 has a dielectric loss of $25 \times 10^{-4}$ or below and a dielectric constant of 30 or below. Accordingly, in the above-mentioned package A, the transmission of high frequency signals can be carried out effectively with a low loss.

In the crystal phase of the sintered body constituting the insulated board 1, there is precipitated a quartz crystal phase having a very high thermal expansion coefficient in a range of room temperature to 400° C. Furthermore, a spinel crystal phase (especially, a willemite crystal phase) having a comparatively high thermal expansion coefficient, a slawsonite crystal phase, or a $ZrO_2$ crystal phase is precipitated. Accordingly, this insulated board 1 has a thermal expansion coefficient in a range of room temperature to 400° C. of at least 7 ppm/° C., preferably at least 9 ppm/° C., most preferably at least 10 ppm/° C., and these thermal expansion coefficients of the insulated board 1 are very close to the thermal expansion coefficients of the organic resin constituting the insulated board 9 in the mother board B. As a result, the thermal expansion difference between the insulated board 1 of the package A and the insulated board 9 of the mother board B is markedly decreased, and the stress due to the thermal expansion between the insulated board 1 and 9 can be effectively alleviated. Accordingly, the occurrence of cracks in the mounted portion or the breaking of the wiring layer which is caused by the heating at the time of mounting a package A on the mother board A or is by a heat stress when the operation and the stopping of the semiconductor element 4 are repeated can be prevented.

(Production of an insulated board)

The above-mentioned insulated board of this invention is prepared by using a powder of crystal glass containing $SiO_2$, $Al_2O_3$, MgO, ZnO and $B_2O_3$ and an $SiO_2$ (quartz) powder as starting materials, mixing these powders with oxide powders used according to the type of crystals to be precipitated. In this case, since a part of $SiO_2$, or a part of $SiO_2$ and $B_2O_3$ are left, and the remaining components are desirably crystallized, it may be preferable to determine the composition of the crystallized glass according to the structure of the desired sintered organization. In the following, one example of the composition of a preferred crystallized glass will be shown according to the structure of the sintered organization.

Sintered organization of FIG. 1: (the composition of crystallized glass)

$SiO_2$: 40–52% by weight
$Al_2O_3$: 14–32% by weight
MgO: 4–15% by weight
ZnO: 6–16% by weight
$S_2O_3$: 5–15% by weight Sintered organizations of FIGS. 2 and 3: (the compositions of crystallized glasses)

$SiO_2$: 40–52% by weight
$Al_2O_3$: 14–32% by weight
MgO: 4–24% by weight
ZnO: 1–16% by weight
$B_2O_3$: 5–16% by weight The crystallized glass powder may be used in an amount of 30 to 95% by weight, especially 60 to 90% by weight, based on the entire powder. If the amount of the glass powder is less than 30% by weight, it is necessary to use a large amount of $B_2O_3$ powder in order to fire the crystallized glass powder at a low temperature of 1000° C. or below. As a result, it becomes difficult to obtain the insulated board having the desired characteristics. When the glass powder is used in an amount of at least 95% by weight, it is difficult to obtain an insulated board especially having a thermal expansion coefficient of at least 7 ppm/° C.

Various oxides to be mixed with the glass powder may be used in the following amounts according to the structure of the desired sintered organization.

The sintered organization shown in FIG. 1: (oxides to be mixed with the glass powder):

$SiO_2$ (quartz) powder: 4.9 to 40% by weight, especially 9 to 30% by weight
ZnO powder: 5 to 25% by weight Sintered organization shown in FIG. 2: (oxides to be mixed with the glass power)

$SiO_2$ (quartz) powder: 4.9 to 40% by weight, especially 9 to 30% by weight
ZnO powder: 0 to 30% by weight
Willemite ($Zn_2SiO_4$) powder: This powder can be used instead of the quartz powder. Accordingly, the above powder may be used in the above range calculated as $SiO_2$.
Complex oxide powder of SrO and $TiO_2$: 0.1 to 10% by weight, 1 to 5% by weight
$B_2O_3$ powder (sintering aid): 0 to 10% by weight or below Sintered organization shown in FIG. 3: (oxides to be mixed with the glass powder)

$SiO_2$ (quartz) powder: 4.9 to 40% by weight, especially 9 to 30% by weight
ZnO powder: 0 to 30% by weight
Willemite ($Zn_2SiO_4$) powder: This powder can be used instead of fused silica powder, and it may be used in the above range calculated as $SiO_2$.
Complex oxide powder of MO(M=Ca, Sr or Ba) and $ZrO_2$: 0.1 to 10% by weight
$B_2O_3$ powder (sintering aid): 0 to 10% by weight or below In the amounts of oxide powders to obtain each sintered organization, when the amount of $SiO_2$ (quartz) powder is smaller than the above range the precipitated amount of the quartz crystal phase becomes small, and it is difficult to increase the thermal expansion coefficient of the insulated board to at least 7 ppm/° C. When the amount of $SiO_2$ powder is used in a larger amount than the above range, the starting materials are difficult to sinter and it is impossible to obtain an elaborate sintered product at a firing temperature of 1000° C. or below.

In the sintered organization shown in FIG. 2, the complex oxide powder ($SrTiO_3$) of SrO and $TiO_2$ is used to precipitate the slawsonite crystal phase. The use of this complex oxide increases the sinterability drastically as a result, firing at a low temperature becomes possible, and voids in the sintered product can be decreased. Accordingly, when the amount of the complex oxide used is smaller than in the above range, it is difficult to precipitate the desired slawsonite crystal phase fully. Furthermore, the increasing effect of sinterability and the decreasing effect of voids become small. $TiO_2$ plays a role of promoting the crystallization of SrO. However, since $TiO_2$ itself has a high dielectric constant, when this complex oxide is used in a larger amount than in the above range, it is inconvenient that the resulting insulated board has a high dielectric constant.

In the sintered organization shown in FIG. 3, the complex oxide powder of MO (M=Ca, Sr or Ba) and $ZnO_2$, for example $CaZrO_3$, is used to precipitate the $ZrO_2$ crystal phase. The use of this complex oxide increases sinterability drastically. As a result, firing at a low temperature becomes possible, and it is possible to reduce voids in the sintered product. Accordingly, when the amount of the complex oxide is smaller than the above range, it becomes difficult to precipitate the desired $ZrO_2$ fully, and in addition, the increasing effect of sinterability and the decreasing effect of voids become small. Furthermore, in the same way as $TiO_2$, since $ZrO_2$ itself has a high dielectric constant, when the complex oxide is used in a larger amount than the above range, the dielectric constant of the resulting insulated board becomes high.

In the sintered organizations shown in FIGS. 2 and 3, ZnO powder and $B_2O_3$ powder are arbitrary components, but especially, these components have an action of increasing sinterability.

A slurry was prepared from a mixed powder composed of the above-mentioned crystallized glass powder and a powder of various oxides by using a suitable organic solvent. By using the resulting slurry, a sheet-like molded product (green sheet) was prepared by known means such as a doctor blade method, a calender roll method, a rolling method and a press molding method. The insulated board could be obtained by firing the green sheet. Usually, a wiring pattern is formed from a metal paste on the green sheet, and the metal paste and the green sheet are simultaneously fired whereby the formation of the insulated board and the formation of the wiring layer are carried out simultaneously to give the insulated board as the wiring board. For example, a throughhole is formed at a predetermined position of the green sheet, and in this through-hole, a metal paste containing a low-resistant metal such as copper, silver and gold is filled. Then, the metal paste is coated on the green sheet in the form of the pattern of the wiring layer (in a thickness of about 5 to 30 μm) by a screen printing method or a gravure printing method. A plurality of green sheets in which such through-holes and the patterns of the wiring layer by the metal paste are overlapped and pressed so that the through-holes may agree, and the green sheets are fired in an oxidizable atmosphere or in a non-oxidizable atmosphere at a temperature of 800 to 1000° C., especially at a temperature of 830 to 1000° C., to give a wiring board.

As stated above, a semiconductor element is loaded on the wiring board, the wiring layer on the wiring board and the semiconductor element are connected so that signals may be transmitted. The connection between the wiring layer and the semiconductor element can be carried out by loading the semiconductor element immediately on the wiring layer, or by using a wire bonding or a TAB tape.

On the surface of the wiring board on which the semiconductor element is loaded, the same kind of material as the insulated board or its insulated material, or a cap composed of a metal having good heat radiation may be conjugated with an adhesive material such as glass, resin or waxy material to seal the semiconductor element hermetically.

EXPERIMENTAL EXAMPLE 1

Two kinds of glasses having the following compositions were prepared.

Glass A: 44% by weight of $SiO_2$—29% by weight of $Al_2O_3$—11% by weight of MgO—7% by weight of ZnO—9% by weight of $B_2O_3$ Glass B: 44% by weight of $SiO_2$—26% by weight of $Al_2O_3$—19% by weight of MgO—1% by weight of ZnO—10% by weight of $B_2O_3$ These glasses were mixed with a ZnO powder and a silica powder (quartz) having an average particle diameter of 1 $\mu$m or less in accordance with the compositions shown in Tables 1 and 2.

An organic binder, a plasticizer and toluene were added to the resulting mixture to prepare a slurry. By using the slurry, a green sheet having a thickness of 300 $\mu$m was prepared by using a doctor blade method. Five such green sheets were laminated, and heat pressed at a temperature of 50° C. under a pressure of 100 Kg/cm². The binder was removed from the resulting laminated plate in a steam-containing nitrogen atmosphere at 700° C., and the laminated plate was fired in dry nitrogen under the conditions shown in Tables 1 and 2 to obtain a sintered body for an insulated board.

The dielectric constant and the dielectric loss of the resulting sintered body were evaluated.

The dielectric constant and the dielectric loss of the sintered body were measured by cutting out the sintered body in the form of a cylindrical shape having a diameter of 10 mm and a thickness of 5 mm, and using a dielectric body cylindrical resonating method using a network analyzer and a synthesized sweeper at 15 to 20 GHz. The measurement was carried out by interposing a dielectric substrate as a sample between Cu jigs having a diameter of 50, and the dielectric constant and the dielectric loss of the sample were calculated by the resonant characteristics of a resonator having a TEO 11 mode.

Furthermore, a thermal expansion curve was taken at a temperature in a range of room temperature to 400° C., and thermal expansion coefficients were calculated. The results of the measurement are shown in Tables 1 and 2.

Crystal phases in the sintered bodies were identified from X-ray diffraction measurement. Elements in an amorphous phase were analyzed by EDX (TEM) and EPMA, and elements having an amount of at least 50 ppm are shown in Tables 1 and 2. Furthermore, the degree of crystallization was calculated by a leat belt method, and the ratio of weight of the amorphous phase was calculated.

Via-holes are formed in the green sheet, and a copper paste is filled in the via-holes. The copper paste is printed and coated on the surface of the sheet in the wiring pattern. On the bottom surface of the green sheet as the lowest layer, and an electrode layer which is electrically connected to an inside wiring layer is formed. Thereafter, five such laminated layers were laminated and fired under the same conditions as above to prepare a multilayer wiring board having a board of 25 mm square and a thickness of 1.2 mm. A ball-like terminal composed of a solder having 90% by weight of Pb and 10% by weight of Sn was secured to the electrode layer of the multilayer wiring board by means of a low-melting solder (composed of 37% by weight of Pb and 63% by weight of Sn). The ball-like terminal was formed on the entire bottom surface at a density of 30 pieces per cm².

As a result, this wiring board was mounted on a print substrate in which a wiring conductor made of a copper foil is formed on the surface of a glass-epoxy insulated board having a thermal expansion coefficient of 13 ppm/° C. at a temperature of 40 to 800° C. The mounting was carried out by positioning the wiring conductor of the surface of the print substrate and the ball-like terminal of the wiring board and using the low-melting solder.

The mounted product in which the multilayer wiring board was mounted on the print substrate was held for 15 minutes/15 minutes in constant temperature tanks kept at a temperature of −40° C. and 125° C. in an atmospheric atmosphere. The above holding operation was counted as one holding operation. This one holding operation was repeated at most 1000 cycles. In each cycle, the electric resistance between the wiring conductor of the printed substrate and the wiring board in each cycle was measured. The number of cycles until a variation in electric resistance appeared are shown in Tables 1 and 2.

In some samples, the sintered product was prepared and assessed by using an $Al_2O_3$ powder and a CaO powder instead of ZnO and $SiO_2$ (samples Nos. 8, 9, 22 and 23). Furthermore, instead of the glasses A and B, glasses C and D were used, and the same evaluation as above was carried out (samples Nos. 24 to 27).

Glass C: 10.4% by weight of $SiO_2$—2.5% by weight of $Al_2O_3$—45.3% by weight of $B_2O_3$—35.2% by weight of CaO—6.6% by weight of $Na_2O$ Glass D: 14% by weight of $SiO_2$—24.7% by weight of $Al_2O_3$—22.6% by weight of $B_2O_3$—14.2% by weight of BaO—12.8% by weight of $Li_2O$—11.7% by weight of $Na_2O$

TABLE 1

| Sample No. | Glass Type | Glass Amount | ZnO | SiO$_2$ | Filler other | | Firing Temp. (° C.) | Firing Time (hr) | Dielectric constant | Dielectric loss × 10$^{-4}$ | Thermal expansion coefficient (ppm/° C.) | Detected crystal phases | Heat cycle test (times) |
|---|---|---|---|---|---|---|---|---|---|---|---|---|---|
| *1 | A | 98 | — | 2 | — | | 1000 | 1 | 5.5 | 60 | 6.2 | SP > Si > Co | 100 |
| 2 | A | 95 | — | 5 | — | | 900 | 1 | 4.6 | 12 | 11.1 | Si > SP > Co | >1000 |
| 3 | A | 80 | 5 | 15 | — | | 950 | 1 | 4.7 | 15 | 10.2 | SP > Si > Co | >1000 |
| 4 | A | 70 | 12 | 18 | — | | 950 | 1 | 5.3 | 17 | 10.3 | Si > SP > Co | >1000 |
| 5 | A | 64 | 7.5 | 27 | B$_2$O$_3$ | 1.5 | 950 | 1 | 4.9 | 18 | 12.4 | Si > SP | >1000 |
| 6 | A | 70 | — | 30 | — | | 850 | 1 | 4.6 | 22 | 13.3 | Si > SP | >1000 |
| *7 | A | 95 | 1 | 4 | — | | 825 | 1 | 5.2 | 30 | 5.1 | SP > Si > Co | 50 |
| *8 | A | 80 | — | — | Al$_2$O$_3$ | 20 | 940 | 0.5 | 5.8 | 46 | 5.6 | SP > Al > Co | 50 |
| *9 | A | 75 | — | — | CaO | 25 | 1000 | 1 | 7.0 | 100 | 6.1 | An > SP | 100 |
| 10 | A | 30 | 20 | 40 | — | | 1000 | 2 | 4.3 | 20 | 13.0 | Si > SP > Co | >1000 |
| 11 | A | 40 | 10 | 40 | B$_2$O$_3$ | 1.5 | 975 | 2 | 4.6 | 21 | 12.5 | Si > SP > Co | >1000 |
| *12 | A | 60 | 35 | 5 | — | | 1200 | 2 | 5.9 | 19 | 6.5 | SP > Co, Si | 100 |
| *13 | A | 30 | 20 | 50 | — | | 1000 | 3 | not elaborated | | — | — | — |
| *14 | A | 30 | 10 | 40 | B$_2$O$_3$ | 20 | 800 | 1 | liquid phase dissolved | | — | — | — |
| *15 | A | 20 | 20 | 40 | B$_2$O$_3$ | 20 | 900 | 1 | liquid phase dissolved | | — | — | — |
| 16 | A | 80 | 10 | 8 | B$_2$O$_3$ | 2 | 950 | 1 | 5.0 | 15 | 7.9 | SP > Si | 800 |
| *17 | A | 75 | 24.9 | 0.1 | — | | 900 | 1 | 5.2 | 18 | 5.6 | SP > Co | 50 |

*marks show samples outside the range of the present invention.
Note 1)
SP: spinel-type crystal phase
Al: Al$_2$O$_3$ crystal phase
Si: Quartz-type crystal phase
W: willemite-type crystal phase
Co: cordierite-type crystal phase
An: anorthite-type crystal phase

TABLE 2

| Sample No. | Glass Type | Glass Amount | ZnO | SiO$_2$ | Filler other | | Firing Temp. (° C.) | Firing Time (hr) | Dielectric constant | Dielectric loss × 10$^{-4}$ | Thermal expansion coefficient (ppm/° C.) | Detected crystal phases | Heat cycle test (times) |
|---|---|---|---|---|---|---|---|---|---|---|---|---|---|
| 18 | B | 40 | 10 | 40 | B$_2$O$_3$ | 10 | 975 | 1 | 4.7 | 23 | 13.3 | Si > SP | >1000 |
| 19 | B | 50 | 10 | 30 | B$_2$O$_3$ | 10 | 975 | 1 | 4.5 | 21 | 12.2 | Si > SP | >1000 |
| 20 | B | 60 | 10 | 25 | B$_2$O$_3$ | 2 | 950 | 1 | 5.2 | 19 | 11.1 | Si > SP > Co | >1000 |
| 21 | B | 70 | 20 | 10 | — | | 900 | 1 | 5.6 | 20 | 7.5 | SP > Si > Co | 800 |
| *22 | B | 85 | — | — | Al$_2$O$_3$ | 15 | 1000 | 1 | 6.0 | 60 | 5.7 | SP > Co > Sl | 50 |
| *23 | B | 80 | — | — | CaO | 20 | 850 | 1 | 6.7 | 110 | 6.5 | SP > An | 100 |
| *24 | C | 75 | 10 | 15 | — | | 800 | 1 | measurement impossible | | — | W > SP > Si | — |
| *25 | C | 50 | 15 | 35 | — | | 850 | 1 | 5.5 | 100 | 15.2 | Si > W > SP | >1000 |
| *26 | D | 75 | 10 | 15 | — | | 800 | 1 | measurement impossible | | 20.3 | An > SP | >1000 |
| *27 | D | 60 | 25 | 15 | — | | 850 | 1 | 6.0 | 150 | 17.1 | SP > An | >1000 |

*marks show samples outside the range of the present invention.
Note 1)
SP: spinel-type crystal phase
Al: Al$_2$O$_3$ crystal phase
Si: Quartz-type crystal phase
W: willemite-type crystal phase
Co: cordierite-type crystal phase
An: anorthite-type crystal phase As is clear from the results given in Table 1, sintered products containing a quartz crystal phase and a gahnite crystal phase as main components and having a high thermal expansion coefficient of at least 7 ppm prepared by this invention had excellent dielectric characteristics such as a dielectric constant of 6 or below and a dielectric loss of 25×10$^{-4}$ or below. In a thermal cycle test, no poor mounting of a printed substrate was developed even after the 1000 cycle test.

On the other hand, in the sample No. 1 in which the amount of the glass containing SiO$_2$—Al$_2$O$_3$—MgO—ZnO—B$_2$O$_3$ as the composition is larger than 95% by weight, it was impossible to achieve a thermal expansion coefficient of at least 7 ppm/° C. The sample No. 15 having the amount of glass less than 30% by weight could not be fired at a low temperature unless B$_2$O$_3$ is compounded in a large amount. As a result, the dielectric characteristics were greatly deteriorated, and could not be measured at a high frequency. The sample No. 12 in which the amount of ZnO exceeded 30% by weight was difficult to be fired at a temperature of 1000° C. or below, and its thermal expansion coefficient was low.

The samples Nos. 1, 7, 17, 22 and 23 in which the amount of $SiO_2$ is smaller than 5% by weight all had a small thermal expansion coefficient. Conversely, the sample No. 13 in which the amount of $SiO_2$ exceeds 40% by weight could not be elaborated at a temperature of 1000° C. or below. Dielectric characteristics were deteriorated, and could not be measured. The samples Nos. 14 and 15 in which the amount of $B_2O_3$ exceeded 10% by weight dissolved the liquid phase and could not be elaborated. The samples Nos. 8, 9, 22 and 23 have $Al_2O_3$ or CaO compounded as additives to the glass. However, the sintered bodies caused crystals such as anorthite or $Al_2O_3$ to precipitate and had a low thermal expansion coefficient.

Furthermore, samples Nos. 24 to 27 using glasses C and D not containing MgO or ZnO tended to increase dielectric loss.

EXPERIMENTAL EXAMPLE 2

The powder of glass A and the powder of glass B used in Experimental Example 1 were mixed with a silica powder (quartz), a ZnO powder, an $SrTiO_3$ and a $B_2O_3$ powder in accordance with the compositions shown in Tables 3 and 4.

An organic binder, a plasticizer and toluene were added to the resulting mixture, and thereafter green sheets having a thickness of 300 μm were prepared by using this slurry by means of the doctor blade method. Five such green sheets were laminated, and heat-pressed at a temperature of 50° C. under a pressure of 100 kg/cm The binder was removed from the resulting laminated plate at 700° C. in a steam-containing nitrogen atmosphere, and the laminated plate was fired in dry nitrogen under the conditions shown in Tables 3 and 4 to give a sintered body for an insulated board.

The dielectric constant, the dielectric loss and the thermal expansion coefficient of the sintered body were measured in the same way as in Experimental Example 1, and the crystal phases and the amorphous phase were identified.

By using the above green sheets, a multilayer wiring board was prepared in the same way as in Experimental Example 1, and subjected to a heat cycle test. On some samples, sintered products were prepared by using an $Al_2O_3$ powder and a cordierite powder in place of ZnO and $SiO_2$ (samples Nos. 8, 9, 22 and 23), and assessed.

The results are shown in Tables 3 and 4.

TABLE 3

| Sample No. | Composition (wt. %) | | | | | | Firing conditions | | Dielectric constant | Dielectric loss × $10^{-4}$ | Thermal expansion coefficient (ppm/° C.) | Detected crystal phases | Heat cycle test (times) |
|---|---|---|---|---|---|---|---|---|---|---|---|---|---|
| | Glass | | Filler | | | | Temp. (° C.) | Time (hr) | | | | | |
| | Type | Amount | ZnO | $SiO_2$ | other | | | | | | | | |
| *1 | A | 98 | — | 1.95 | $SrTiO_3$ | 0.05 | 1000 | 1 | 5.5 | 60 | 6.5 | SP > Si > Co | 100 |
| 2 | A | 95 | — | 4.9 | $SrTiO_3$ | 0.1 | 850 | 1 | 4.8 | 16 | 11.8 | Si > SP > SL > Co | >1000 |
| 3 | A | 80 | — | 15 | $SrTiO_3$ | 5 | 875 | 1 | 4.9 | 18 | 10.7 | Si > SP > SL > Co | >1000 |
| 4 | A | 70 | 9 | 18 | $SrTiO_3$ | 3 | 900 | 1 | 5.4 | 19 | 11.0 | Si > SP > SL > Co | >1000 |
| 5 | A | 64 | 7.5 | 25 | $SrTiO_3$ $B_2O_3$ | 2 1.5 | 925 | 1 | 5.0 | 21 | 12.7 | Si > SP > SL | >1000 |
| 6 | A | 70 | — | 20 | $SrTiO_3$ | 10 | 850 | 0.5 | 5.8 | 24 | 13.5 | Si > SP > SL | >1000 |
| *7 | A | 95 | 1 | 4 | — | | 825 | 1 | 5.2 | 30 | 5.1 | Si > SP > Co | 50 |
| *8 | A | 80 | — | — | $Al_2O_3$ | 20 | 940 | 0.5 | 5.8 | 46 | 5.6 | SP > Al > Co | 50 |
| *9 | A | 75 | — | — | Co | 25 | 1000 | 1 | 5.3 | 100 | 6.1 | Co > SP | 100 |
| 10 | A | 30 | 20 | 35 | $SrTiO_3$ $B_2O_3$ | 5 10 | 975 | 2 | 5.2 | 23 | 13.5 | Si > SP > SL > Co | >1000 |
| 11 | A | 40 | 10 | 36 | $SrTiO_3$ $B_2O_3$ | 4 10 | 975 | 1 | 5.4 | 24 | 12.8 | Si > SP > SL > Co | >1000 |
| *12 | A | 60 | 35 | 5 | — | | 1200 | 2 | 5.9 | 19 | 6.5 | SP > Co, Si | 100 |
| *13 | A | 30 | 20 | 50 | — | | 1000 | 3 | not elaborated | | — | — | |
| *14 | A | 30 | 10 | 40 | $B_2O_3$ | 20 | 800 | 1 | liquid phase dissolved | | — | — | |
| *15 | A | 20 | 20 | 40 | $B_2O_3$ | 20 | 900 | 1 | liquid phase dissolved | | — | — | |
| 16 | A | 80 | 9 | 8 | $SrTiO_3$ $B_2O_3$ | 1 2 | 900 | 1 | 5.3 | 20 | 8.2 | SP > Si > SL | 800 |
| *17 | A | 75 | 24.9 | 0.1 | — | | 900 | 1 | 5.2 | 18 | 5.6 | SP > Co | 50 |

*marks show samples outside the range of the present invention.
Note 1)
SP: spinel,
SL: slawsonite,
Co: cordierite,
Si: quartz,
Al: $Al_2O_3$

TABLE 4

| Sample No. | Composition (wt. %) | | | | | Firing conditions | | Dielectric constant | Dielectric loss × 10⁻⁴ | Thermal expansion coefficient (ppm/° C.) | Detected crystal phases | Heat cycle test (times) |
|---|---|---|---|---|---|---|---|---|---|---|---|---|
| | Glass | | | Filler | | Temp. (° C.) | Time (hr) | | | | | |
| | Type | Amount | ZnO | SiO$_2$ | other | | | | | | | |
| 18 | B | 40 | 10 | 40 | SrTiO$_3$ 3<br>B$_2$O$_3$ 7 | 950 | 1 | 5.2 | 26 | 13.5 | Si > SP > SL | >1000 |
| 19 | B | 50 | 10 | 30 | SrTiO$_3$ 1<br>B$_2$O$_3$ 9 | 950 | 1 | 5.0 | 24 | 12.6 | Si > SP > SL | >1000 |
| 20 | B | 63 | 8 | 25 | SrTiO$_3$ 2<br>B$_2$O$_3$ 2 | 925 | 1 | 5.6 | 23 | 11.4 | Si > SP > SL > Co | >1000 |
| 21 | B | 70 | 19.5 | 10 | SrTiO$_3$ 0.5 | 875 | 1 | 5.7 | 21 | 7.9 | Si > SP > SL > Co | 800 |
| *22 | B | 85 | — | — | Al$_2$O$_3$ 15 | 1000 | 1 | 6.0 | 60 | 5.7 | SP > Co > Al | 50 |
| *23 | B | 80 | — | — | Co 20 | 850 | 1 | 5.4 | 110 | 6.5 | SP > Co | 100 |

*marks show samples outside the range of the present invention.
Note 1)
SP: spinel,
SL: slawsonite,
Co: cordierite,
Si: quartz,
Al: Al$_2$O$_3$ As is clear from the results shown in Tables 3 and 4, sintered bodies composed mainly of the quartz type crystal phase and the gahnite-type crystal phase and containing a slawsonite-type crystal phase and having a high thermal expansion coefficient of at least 7 ppm/° C. had excellent dielectric characteristics such as a dielectric constant of 6 or less and a dielectric loss of 30×10⁻⁴ or less at a measured frequency of 15 to 20 GHz, and in mounting on a printed substrate, no poor 10 mounting of the printed substrate was developed even after the 1000 cycle test.

On the other hand, the sample No. 1 in which the amount of glass containing SiO$_2$—Al$_2$O$_3$—MgO—ZnO—B$_2$O$_3$ was greater than 95% by weight could not achieve a thermal expansion coefficient of at least 7 ppm/° C. The sample No. 15 in which the amount of the above glass was less than 30% by weight was difficult to be fired at a low temperature unless B$_2$O$_3$ was compounded in a large amount. As a result, the liquid phase component was dissolved, and a sintered body could not be prepared. Furthermore, the sample No. 12 in which the amount of ZnO exceeded 30% by weight was difficult to be fired at a temperature of 1000° C. or below, and its thermal expansion coefficient was low.

Furthermore, the samples Nos. 1, 7, 8, 9, 17, 22 and 23 in which SiO$_2$ was not added, or the amount of SiO$_2$ was smaller than 4.9% by weight all had a low thermal expansion coefficient. Conversely, the sample No. 13 in which the amount of SiO$_2$ exceeded 40% by weight could not be elaborated at a temperature of 1000° C. or below. The samples Nos. 14 and 15 dissolved out the liquid phase and could not be elaborated.

The samples Nos. 8, 9, 22 and 23 were prepared by compounding Al$_2$O$_3$ or cordierite as additives to glass, but crystals such as cordierite or Al$_2$O$_3$ were precipitated in the sintered bodies, and these sintered bodies had low thermal expansion coefficients.

EXPERIMENTAL EXAMPLE 3

The powder of glass A and the powder of glass B used in Experimental Example 1 were mixed with a silica powder (quartz) and a ZnO powder having an average particle diameter of 1 μm or below, an MZrO$_3$ powder (M is at least one element selected from Ca, Sr and Ba), and a B$_2$O$_3$ powder according to the compositions shown in Tables 5 and 6.

In the same way as in Experimental Example 1, green sheets were prepared by using the mixed powder, and from these green sheets, sintered bodies for an insulated board were prepared.

By using the above green sheets, the same multilayered wiring board as in Experimental Example 1 were prepared.

These sintered bodies and the multilayered wiring board were subjected to the same tests as in Experimental Example 1, and the results are shown in Tables 5 and 6.

TABLE 5

| Sample No. | Composition (wt. %) | | | | | Firing conditions | | Dielectric constant | Dielectric loss × 10⁻⁴ | Thermal expansion coefficient (ppm/° C.) | Detected crystal phases | Heat cycle test (times) |
|---|---|---|---|---|---|---|---|---|---|---|---|---|
| | Glass | | | Filler | | Temp. (° C.) | Time (hr) | | | | | |
| | Type | Amount | ZnO | SiO$_2$ | other | | | | | | | |
| *1 | A | 98 | — | 1.95 | CaZrO$_3$ 0.05 | 1000 | 1 | 5.4 | 65 | 6.4 | SP > Si > Co | 100 |
| 2 | A | 95 | — | 4.9 | CaZrO$_3$ 0.1 | 875 | 1 | 4.9 | 17 | 12.0 | Si > SP > Z(T) > Co | >1000 |
| 3 | A | 80 | — | 15 | CaZrO$_3$ 5 | 850 | 1 | 5.0 | 19 | 11.0 | Si > SP > Z(T), Z(M) > Co | >1000 |
| 4 | A | 70 | 9 | 18 | CaZrO$_3$ 3 | 875 | 1 | 5.5 | 20 | 11.5 | Si > SP > Z(T) > Co | >1000 |

TABLE 5-continued

| Sample No. | Glass Type | Glass Amount | Filler ZnO | Filler SiO$_2$ | Filler other | | Firing conditions Temp. (° C.) | Firing conditions Time (hr) | Dielectric constant | Dielectric loss × 10$^{-4}$ | Thermal expansion coefficient (ppm/° C.) | Detected crystal phases | Heat cycle test (times) |
|---|---|---|---|---|---|---|---|---|---|---|---|---|---|
| 5 | A | 64 | 7.5 | 25 | CaZrO$_3$ B$_2$O$_3$ | 2 1.5 | 900 | 1 | 5.2 | 23 | 13.0 | Si > SP > Z(T), Z(M) | >1000 |
| 6 | A | 70 | — | 20 | CaZrO$_3$ | 10 | 875 | 0.5 | 5.9 | 25 | 13.2 | Si > SP > Z(T) | >1000 |
| *7 | A | 95 | 1 | 4 | — | | 850 | 1 | 5.0 | 31 | 5.2 | Si > SP > Co | 50 |
| *8 | A | 80 | — | — | Al$_2$O$_3$ | 20 | 950 | 0.5 | 5.9 | 47 | 5.5 | SP > Al > Co | 50 |
| *9 | A | 75 | — | — | Co | 25 | 1000 | 2 | 5.5 | 105 | 6.3 | Co > SP | 100 |
| 10 | A | 30 | 20 | 35 | CaZrO$_3$ B$_2$O$_3$ | 5 10 | 950 | 2 | 5.3 | 25 | 13.7 | Si > SP > Z(T), Z(M) > Co | >1000 |
| 11 | A | 40 | 10 | 36 | CaZrO$_3$ B$_2$O$_3$ | 4 10 | 950 | 1 | 5.6 | 26 | 13.0 | Si > SP > Z(T), Z(M) > Co | >1000 |
| *12 | A | 60 | 35 | 5 | — | | 1200 | 2 | 6.1 | 20 | 6.7 | SP > Co, Si | 100 |
| *13 | A | 30 | 20 | 50 | — | | 1000 | 3 | not elaborated | | — | | — |
| *14 | A | 30 | 10 | 40 | B$_2$O$_3$ | 20 | 825 | 1 | liquid phase dissolved | | — | | — |
| *15 | A | 20 | 20 | 40 | B$_2$O$_3$ | 20 | 925 | 1 | liquid phase dissolved | | — | | — |
| 16 | A | 80 | 9 | 8 | CaZrO$_3$ B$_2$O$_3$ | 1 2 | 900 | 1 | 5.5 | 23 | 8.3 | SP > Si > Z(T) | 800 |
| *17 | A | 75 | 24.9 | 0.1 | — | | 900 | 1 | 5.4 | 20 | 5.4 | SP > Co | 50 |
| 18 | A | 80 | — | 15 | SrZrO$_3$ | 5 | 900 | 1 | 5.2 | 17 | 11.2 | Si > SP > Z(T), Z(M) | >1000 |
| 19 | A | 80 | 3 | 15 | BaZrO$_3$ | 2 | 875 | 1 | 5.7 | 18 | 11.0 | Si > SP > Z(T) | >1000 |

*marks show samples outside the range of the present invention.
Note 1)
SP: spinel,
Si: quartz,
Co: cordierite,
Al: Al$_2$O$_3$
Z(T): zirconia (tetragonal),
Z(M): zirconia (monocrystal)

TABLE 6

| Sample No. | Glass Type | Glass Amount | Filler ZnO | Filler SiO$_2$ | Filler other | | Firing conditions Temp. (° C.) | Firing conditions Time (hr) | Dielectric constant | Dielectric loss × 10$^{-4}$ | Thermal expansion coefficient (ppm/° C.) | Detected crystal phases | Heat cycle test (times) |
|---|---|---|---|---|---|---|---|---|---|---|---|---|---|
| 20 | B | 40 | 10 | 40 | CaZrO$_3$ B$_2$O$_3$ | 3 7 | 925 | 1 | 5.5 | 27 | 13.3 | Si > SP > Z(T), Z(M) | >1000 |
| 21 | B | 50 | 10 | 30 | CaZrO$_3$ B$_2$O$_3$ | 1 9 | 975 | 1 | 5.2 | 25 | 12.7 | Si > SP > Z(T), Z(M) | >1000 |
| 22 | B | 63 | 8 | 25 | CaZrO$_3$ B$_2$O$_3$ | 2 2 | 925 | 1 | 5.7 | 26 | 11.7 | Si > SP > Z(T) > Co | >1000 |
| 23 | B | 70 | 19.5 | 10 | CaZrO$_3$ | 0.5 | 875 | 1 | 5.9 | 24 | 7.8 | Si > SP > Z(T) > Co | 800 |

*marks show samples outside the range of the present invention.
Note 1)
SP: spinel,
Si: quartz,
Z(T): zirconia (tetragonal),
Z(M): zirconia (monocrystal)

As is clear from the results shown in Tables 5 and 6, sintered bodies containing a quartz-type crystal phase and a spinel-type crystal phase as main components and comprising a ZrO$_2$ and having a high thermal expansion coefficient of at least 7 ppm/° C. had excellent dielectric characteristics such as a dielectric constant of 6 or below and a dielectric loss of 30×10$^{-4}$. In mounting the print substrate, no poor mounting of the print substrate was developed after the 1000 cycle test.

On the other hand, the sample No. 1 in which the amount of the glass having a composition containing SiO$_2$—Al$_2$O$_3$—MgO—ZnO—B$_2$O$_3$ was greater than 95% by weight could not achieve a thermal expansion coefficient of at least 7 ppm/° C. The sample No. 15 in which the amount of SiO$_2$ was smaller than 30% by weight was difficult to be sintered at a low temperature unless a large amount of B$_2$O$_3$ was compounded. As a result, the liquid phase component was dissolved, a sintered body could not be produced. Furthermore, the sample No. 12 in which the amount of ZnO exceeded 30% by weight was difficult to be fired at a temperature of 1000° C. or below. The above sample 1 No. 12 had a low thermal expansion coefficient.

The samples Nos. 1, 7 and 17 in which SiO$_2$ was not added or the amount of SiO$_2$ was smaller than 4.9% by weight had a low thermal expansion coefficient. Conversely, the sample No. 13 in which the amount of $SiO_2$ exceeded 40% by weight could not be elaborated at a temperature of 1000° C. or below.

In the samples 14 and 15 in which the amount of $B_2O_3$ exceeded 10% by weight, the liquid phase was dissolved, and these samples could not be elaborated.

The samples Nos. 8 and 9 were obtained by compounding $Al_2O_3$ or cordierite as an additive component to glass, but a crystal such as cordierite or $Al_2O_3$ was precipitated in the sintered body, and the resulting sintered bodies had a low thermal expansion coefficient.

What is claimed is:

1. An insulated board for a wiring board, comprising a sintered body composed of a complex oxide containing Si, Al, Mg, Zn and B as constituent elements,
    wherein said sintered body contains, as a main crystal phase, a spinel crystal phase containing ZnO and $Al_2O_3$ and a quartz crystal phase, the sintered body further containing a slawsonite crystal phase and/or a tetragonal zirconia crystal phase,
    wherein said insulated board has a dielectric loss of $30 \times 10^{-4}$ or less and a dielectric constant of 30 or less at a frequency of 15 to 20 GHz, and a thermal expansion coefficient of at least 7 ppm/° C. at room temperature to 400° C.,
    and wherein the insulated board is prepared by firing a molded product containing (1) 30 to 95% by weight of a crystallized glass powder containing 40 to 52% by weight of $SiO_2$, 14 to 32% by weight of $Al_2O_3$, 4 to 24% by weight of MgO, 1 to 16% by weight of ZnO, and 5 to 15% by weight of $B_2O_3$, (2) 4.9 to 40% by weight of a quartz powder, and (3) 0.1 to 10% by weight of $SrTiO_3$ and/or 0.1 to 10% by weight of $MZrO_3$ powder (where M is Ba, Sr or Ca).

2. An insulated board of claim 1 wherein the sintered body contains at least one crystal phase selected from the group consisting of a willemite crystal phase, an enstatite crystal phase, and a cordierite crystal phase.

3. An insulated board of claim 2 wherein the sintered body contains a cordierite crystal phase.

4. An insulated board of claim 3 wherein the molded product further contains 0 to 30% by weight of ZnO powder and 0 to 10% by weight of $B_2O_3$, and is fired at a temperature of 830 to 1000° C.

5. An insulated board of claim 1 wherein the molded product further contains ZnO or $B_2O_3$ and is fired at a temperature of 830 to 1000° C.

6. An insulated board of claim 1 wherein the sintered body contains a slawsonite crystal phase.

7. An insulated board of claim 6 wherein the molded product contains 0.1 to 10% by weight of $SrTiO_3$, 0 to 30% by weight of ZnO powder and 0 to 10% by weight of $B_2O_3$ powder, and is fired at a temperature of 830 to 1000° C.

8. An insulated board of claim 1 wherein the sintered body contains a tetragonal $ZrO_2$ crystal phase.

9. An insulated board of claim 8 wherein the molded product contains 0.1 to 10% by weight of $MZrO_3$ powder (wherein M is Ba, Sr or Ca), 0 to 30% by weight of ZnO powder and 0 to 10% by weight of $B_2O_3$, and is fired at a temperature of 830 to 1000° C.

* * * * *